United States Patent
Pham et al.

(10) Patent No.: US 9,105,827 B2
(45) Date of Patent: Aug. 11, 2015

(54) METHOD FOR BONDING SEMICONDUCTOR SUBSTRATES

(71) Applicant: IMEC, Leuven (BE)

(72) Inventors: Nga Phuong Pham, Leuven (BE); Maarten Rosmeulen, Leuven (BE); Bart Vandevelde, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/322,787

(22) Filed: Jul. 2, 2014

(65) Prior Publication Data

US 2014/0312359 A1  Oct. 23, 2014

Related U.S. Application Data

(63) Continuation of application No. 13/678,340, filed on Nov. 15, 2012, now Pat. No. 8,772,131.

(30) Foreign Application Priority Data

Nov. 29, 2011 (EP) .................................. 11191148

(51) Int. Cl.
*H01L 33/62* (2010.01)
*H01L 33/32* (2010.01)
*H01L 23/00* (2006.01)
*H01L 33/00* (2010.01)
*H01L 21/18* (2006.01)
*H01L 33/12* (2010.01)

(52) U.S. Cl.
CPC .............. *H01L 33/62* (2013.01); *H01L 21/187* (2013.01); *H01L 24/02* (2013.01); *H01L 33/005* (2013.01); *H01L 33/0079* (2013.01); *H01L 33/32* (2013.01); *H01L 33/007* (2013.01); *H01L 33/12* (2013.01); *H01L 2924/12041* (2013.01)

(58) Field of Classification Search
None
See application file for complete search history.

(56) References Cited

U.S. PATENT DOCUMENTS

| 5,471,092 A | 11/1995 | Chan et al. |
| 7,253,504 B1 | 8/2007 | Zhai et al. |
| 2004/0135166 A1 | 7/2004 | Yamada et al. |
| 2005/0048739 A1 | 3/2005 | Kerdiles et al. |
| 2005/0242365 A1* | 11/2005 | Yoo ................................ 257/103 |
| 2007/0001190 A1 | 1/2007 | Kim et al. |
| 2007/0020908 A1 | 1/2007 | Honer et al. |

(Continued)

FOREIGN PATENT DOCUMENTS

| JP | 2001-44317 A | 2/2001 |
| WO | WO 93/26041 A1 | 12/1993 |
| WO | WO 01/70005 A2 | 9/2001 |

*Primary Examiner* — Angel Roman
(74) *Attorney, Agent, or Firm* — Knobbe Martens Olson & Bear, LLP

(57) ABSTRACT

A method is provided for bonding a first substrate carrying a semiconductor device layer on its front surface to a second substrate. The method comprises producing the semiconductor device layer on the front surface of the first substrate, depositing a first metal bonding layer or a stack of metal layers on the first substrate, on top of the semiconductor device layer, depositing a second metal bonding layer or a stack of metal layers on the front surface of the second substrate, depositing a metal stress-compensation layer on the back side of the second substrate, thereafter establishing a metal bond between the first and second substrate, by bringing the first and second metal bonding layers or stacks of layers into mutual contact under conditions of mechanical pressure and temperature suitable for obtaining the metal bond, and removing the first substrate.

19 Claims, 3 Drawing Sheets

(56) References Cited

U.S. PATENT DOCUMENTS

| | | |
|---|---|---|
| 2008/0157107 A1 | 7/2008 | Shei et al. |
| 2009/0085150 A1 | 4/2009 | Takao |
| 2009/0085228 A1 | 4/2009 | Sun et al. |
| 2010/0109035 A1 | 5/2010 | Cho et al. |
| 2010/0314725 A1 | 12/2010 | Gu et al. |
| 2011/0186959 A1 | 8/2011 | Jerome et al. |

\* cited by examiner

US 9,105,827 B2

METHOD FOR BONDING SEMICONDUCTOR SUBSTRATES

CROSS-REFERENCE TO RELATED APPLICATIONS

Any and all priority claims identified in the Application Data Sheet, or any correction thereto, are hereby incorporated by reference under 37 CFR 1.57. This application is a continuation of U.S. application Ser. No. 13/678,340 filed Nov. 15, 2012, which claims the benefit of European Application No. 11191148.3 filed Nov. 29, 2011. Each of the aforementioned applications is incorporated by reference herein in its entirety, and each is hereby expressly made a part of this specification.

FIELD OF THE INVENTION

Methods of bonding semiconductor substrates by a permanent metal bond, for example a permanent Cu/Sn bond, in semiconductor processing are provided. The methods are particularly suitable in the field of LED devices, such as GaNLEDs.

BACKGROUND OF THE INVENTION

One way of producing gallium nitride light emitting diode (GaNLED) devices is by a transfer process applied after the fabrication of LEDs on 4 inch Si (111) wafers comprising p and n contact formation to the GaN layer. Such a process is described in 'Substrate Transfer for GaN based LEDs grown in Silicon', Pham et al, Proceedings 44th International Symposium on Microelectronics IMAPS 2011, Long Beach Calif. After applying a passivation layer, a bonding metal, preferably a Cu/Sn layer is deposited on the GaN layer and on a Si carrier wafer. The wafer is then bonded to the Si carrier wafer using metallic bonding at a temperature of about 250° C. Next, the original Si device wafer is completely removed by grinding and wet etching. GaN-LEDs are thus transferred to a new carrier wafer. A typical problem in this type of process is the occurrence of high stress in the Cu layer during bonding and consequently large wafer warpage when the device substrate is removed. Such a large wafer warpage causes problems for some automatic handling tools and processes like lithography. This problem occurs not only in the above-described GaNLED production process, but in any substrate transfer process involving a permanent metal bond such as a Cu/Sn bond between a carrier substrate and a device produced on a temporary device substrate.

SUMMARY OF THE INVENTION

The embodiments are related to a method as disclosed in the appended claims. The embodiments are thus related to a method for bonding a first substrate having a front and back surface, and carrying a semiconductor device layer on its front surface to a second substrate having a front and back surface, the method comprising the steps of:
  Producing the semiconductor device layer on the front surface of the first substrate,
  Depositing a first metal bonding layer or a stack of metal layers on the first substrate, on top of the semiconductor device layer,
  Depositing a second metal bonding layer or a stack of metal layers on the front surface of the second substrate,
  Establishing a metal bond between the first and second substrate, by bringing the first and second metal bonding layers or stacks of layers into mutual contact under conditions of mechanical pressure and temperature suitable for obtaining the metal bond,
  Removing the first substrate, wherein a metal stress-compensation layer is deposited on the back side of the second substrate, before the step of establishing a metal bond between the first and second substrate. A device layer is defined in the context of this description as an essentially continuous layer comprising at least one semiconductor device.

According to a preferred embodiment, the stress compensation layer is a single layer of the same material as the metal bonding layer deposited on the front side of the second substrate or of the first layer of the stack of layers.

The thickness of the stress compensation layer is preferably at least equal to the thickness of the metal bonding layer at the front side of the second substrate, or of the first layer of a stack of layers deposited at the front side of the second substrate.

According to an embodiment, the thickness of the stress compensation layer is equal to the sum of the thicknesses of the metal bonding layers or of the first layers of layer stacks deposited on the surfaces to be bonded.

Preferably, the stress compensation layer is deposited on the back side of the second substrate before the step of depositing a second metal bonding layer or a stack of layers on the front side of the second substrate.

According to an embodiment, a stack of metal bonding layers is deposited on at least one of the surfaces of the first and second substrate that are to be bonded, and the stack comprises a Cu layer and a Sn layer on top of and in direct contact with the Cu layer.

A protection layer may be deposited on top of the stress-compensation layer. The protection layer may be a SiN layer.

A diffusion-inhibiting layer may be produced between the second substrate and the stress compensation layer. The diffusion-inhibiting layer may be a SiN layer.

The embodiments are equally related to a semiconductor device comprising a wafer portion, a device portion on one side of the wafer portion, and a stress compensation layer on the other side of the wafer portion.

A protection layer may be further present on the stress compensation layer.

A diffusion-inhibiting layer may be present between the wafer portion and the stress compensation layer. According to an embodiment, the device is a GaNLED device.

DETAILED DESCRIPTION OF THE PREFERRED EMBODIMENTS

The embodiments are related to a process wherein a metal bonding step is applied to establish a bond between a first substrate carrying a semiconductor device, e.g. a GaNLED device, and a second substrate. Hereafter, the first substrate will be referred to as the 'device wafer', and the second substrate as the 'carrier wafer', as the method is firstly applicable to semiconductor wafers. It is emphasized though that the term 'substrate' can be any object that is suitable for being used in a bonding process. In the method of an embodiment, a metal bonding layer or a stack of metal bonding layers, for example a layer of Cu with a layer of Sn directly on the Cu layer is deposited on each of the surfaces that are to be bonded. According to an embodiment, a stress compensation layer is provided at the backside of the carrier wafer, before the metal bonding step is performed. Preferably, the stress compensation layer is a single layer of the same material as the metal bonding layer deposited on the front side (i.e. the side to be bonded), of the carrier wafer. If a stack of bonding layers is deposited on the front side, the material of the compensation layer is the same as that of the first layer of the stack ('first' being at the bottom of the stack). The thickness of the stress compensation layer is at least equal to the thickness of the metal layer at the front side of the carrier wafer, or of the first layer of a stack of layers deposited at the front side of the carrier. According to a more preferred embodiment, the thickness of the stress compensation layer is equal to the sum of the thicknesses of the metal layers or of the first layers of layer stacks deposited on the surfaces to be bonded (i.e. the surfaces of the device wafer and the carrier wafer).

For example, when a Cu/Sn stack is deposited on the device wafer and on the carrier wafer, the stress compensation layer is a Cu layer the thickness of which is the sum of the Cu layers on the device and the carrier wafers. If one wafer comprises a single bonding layer and the other a stack of bonding layers, the latter embodiment signifies that the thickness of the stress compensation layer is equal to the sum of the thicknesses of the single bonding layer and the first of the stack of layers.

In the method of an embodiment, the stress compensation layer at the back of the carrier wafer undergoes the same changes in stress as the bonding layer of the same material at the front of the carrier. Any tensile stress appearing in the bonding layer that would induce warpage is thereby compensated, so that the carrier wafer remains flat throughout the bonding process, and after the removal of the device wafer.

Figure 1:
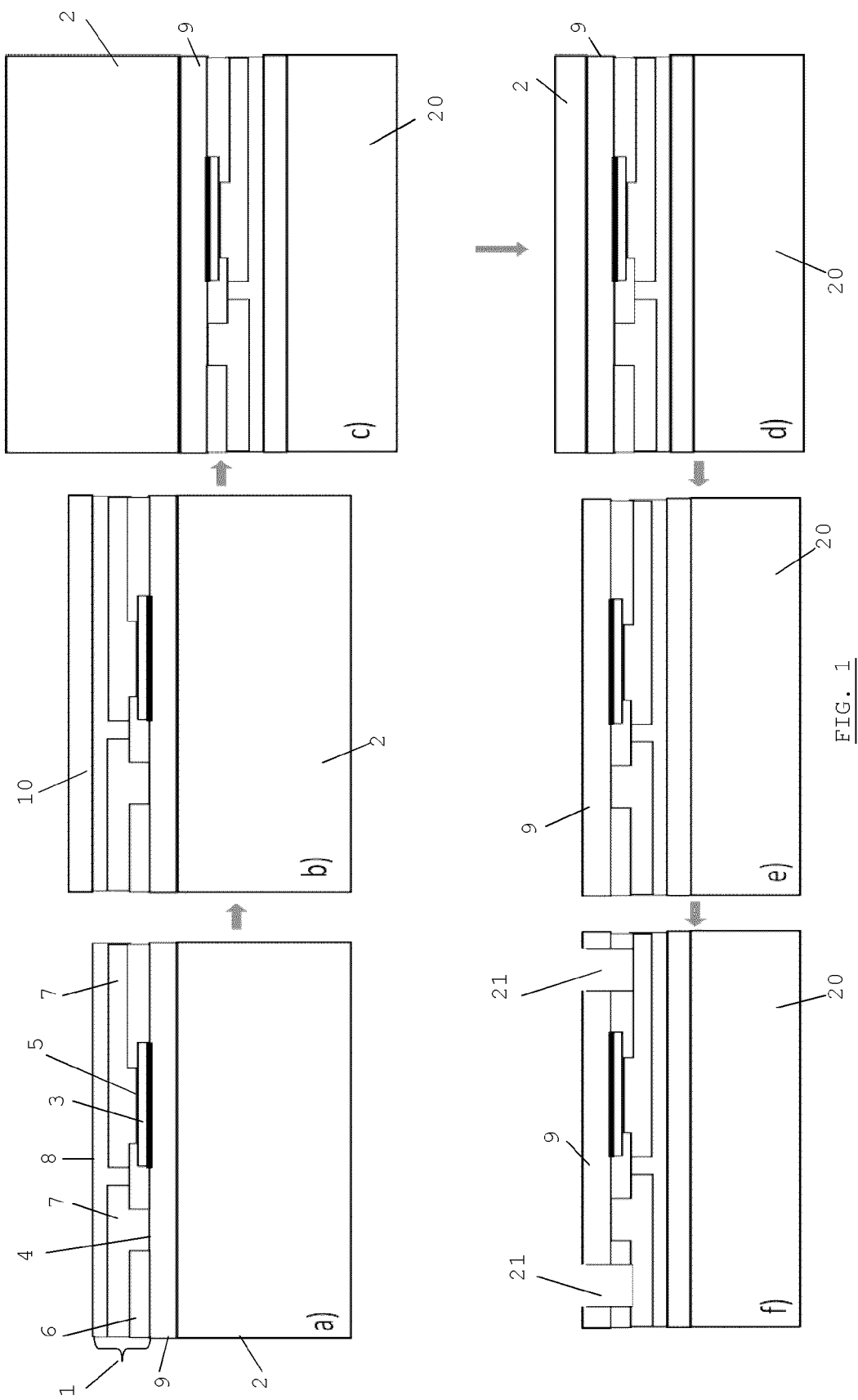
FIGS. 1a through 1f illustrate a prior art process for transferring a GaNLED device from a first substrate to a second (carrier) substrate.

A preferred embodiment is described hereafter in more detail. This is the case described in the above cited reference (Pham et al.), wherein the semiconductor device is a GaN-LED device, produced on a first Si-wafer, and bonded to a second (carrier) Si wafer by establishing a Cu/Sn bond. FIG. 1 gives an overview of the bonding steps according to this method. All parameter values given hereafter are cited by way of example only and are not limiting the scope of the invention. First, the GaNLED device layer 1 is produced on a Si(111) wafer 2 (FIG. 1a). This may take place by the following steps, as known in the art:
1. epitaxial growth of GaN-based LED layers,
2. dopant activation anneal,
3. dry etching of the LED mesa 3,
4. patterning of Ag-based p-type and Ti/Al-based n-type contacts 4/5 using lift-off,
5. deposition of a CVD SiO$_2$ inter-metal dielectric (IMD) 6,
6. patterning of contact holes towards the p- and n-type electrodes using dry etch,
7. deposition and patterning of an Au-based interconnect layer 7 and
8. deposition of a CVD SiO$_2$ passivation layer 8.

The GaN-based LED layers may be deposited using a 4 inch Aixtron MOCVD epi reactor. The total stack thickness is about 3.7 µm and consists of a buffer layer comprising AlN/AlGaN/GaN layers to reduce defect density, n-type Si-doped and p-type Mg-doped GaN cladding layers, multiple InGaN quantum wells (MQW) and an InGaN electron blocking layer (EBL). The mesa etch removes the pGaN, EBL, MQW and part of the nGaN layer such that the remaining thickness of the GaN stack 9 in field regions is 2.8 to 3 µm.

Figure 2:
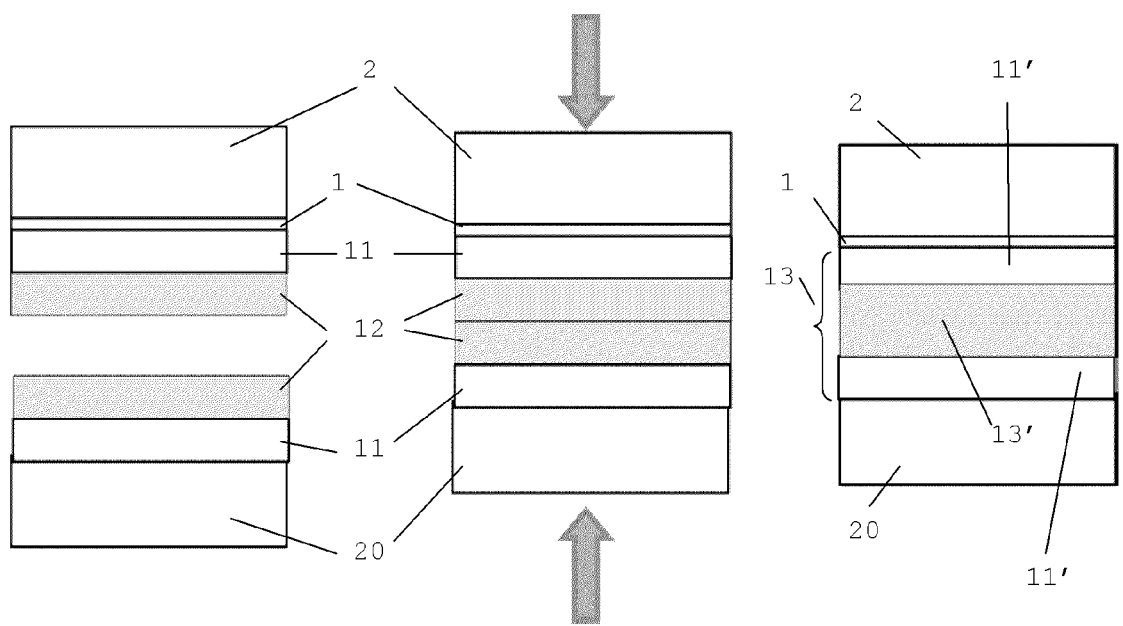
FIG. 2 shows details of the metal bonding steps taking place in the process of FIG. 1.

Then the Cu/Sn bonding layers 10 are produced, see FIG. 1b and illustrated in more detail in FIG. 2 (in FIG. 2, the GaN stack 9 is not shown for the sake of simplicity). A seed layer for Cu deposition (e.g. 30 nmTiW/150 nm, not shown) may be deposited on top of the oxide passivation of the device wafer. The same type of seed layer may be deposited directly on the Si (100) carrier wafer. After seed layer deposition, a 5 µm Cu layer followed by a 10 µm Sn layer 12 are deposited on the device wafer using electroplating. The same layer of Cu/Sn is then electroplated on the carrier wafer 20. Other compositions of the metal layers may be used, and other thicknesses of these layers. For example, one surface may receive a Cu/Sn layer while the other receives only a Cu layer. The advantage of using a Cu/Sn layer on both sides is that it does not require any cleaning treatment of the Sn surface before bonding. Also, the Cu layers 11 on the device wafer and the carrier wafer may have different thicknesses, although in general the Cu bonding layer on both device and carrier have the same thickness.

After metallization, the two wafers are bonded (FIG. 1c) in a suitable apparatus, e.g. an EVG 520 bonder, using a sequence as shown in FIG. 2. First, the two wafers are brought into contact. Then, the temperature of the bonding chuck is raised to 250° C. and maintained for 10 min. At the same time, a load of 1000N is applied to the wafer stack. Again, these parameters are mere examples and not limiting to the invention scope. The metallic bonding is made by diffusion soldering (or transient liquid phase soldering) of the Cu—Sn system. The solder layers 12 (Sn) melt and diffuse into the two parent layers (Cu) at moderate temperatures (250° C.), thereby forming a layer 13, comprising a central layer 13' of copper-tin intermetallics (Cu$_x$Sn$_y$), and still a layer 11' of Cu on either side (the thickness of the Cu layers 11' being normally smaller than the thickness of the original Cu layers 11). The Cu$_x$Sn$_y$ intermetallics have a much higher melting temperature (>415° C.) than the original Sn (232° C.). This provides an advantage such that, during any subsequent (high temperature) processing, the metallic seal remains in a solid state.

Then the Si(111) device wafer 2 is removed in two processing steps: Thinning down the Si device wafer to a thickness of ~100 µm or lower (FIG. 1d) and wet etching of the remaining Si (FIG. 1e). Thinning of the Si wafer from the original thickness of 1000 µm down to 100 µm may be performed by grinding or lapping and polishing. To further remove the Si device wafer, an isotropic Si wet etching process may be applied using an HNA solution (etch solution composed of HF: HNO3: CH3COOH). These steps are then followed by a texturization step (not shown), and by the opening of the contacts 21 (FIG. 1f).

Figure 3:
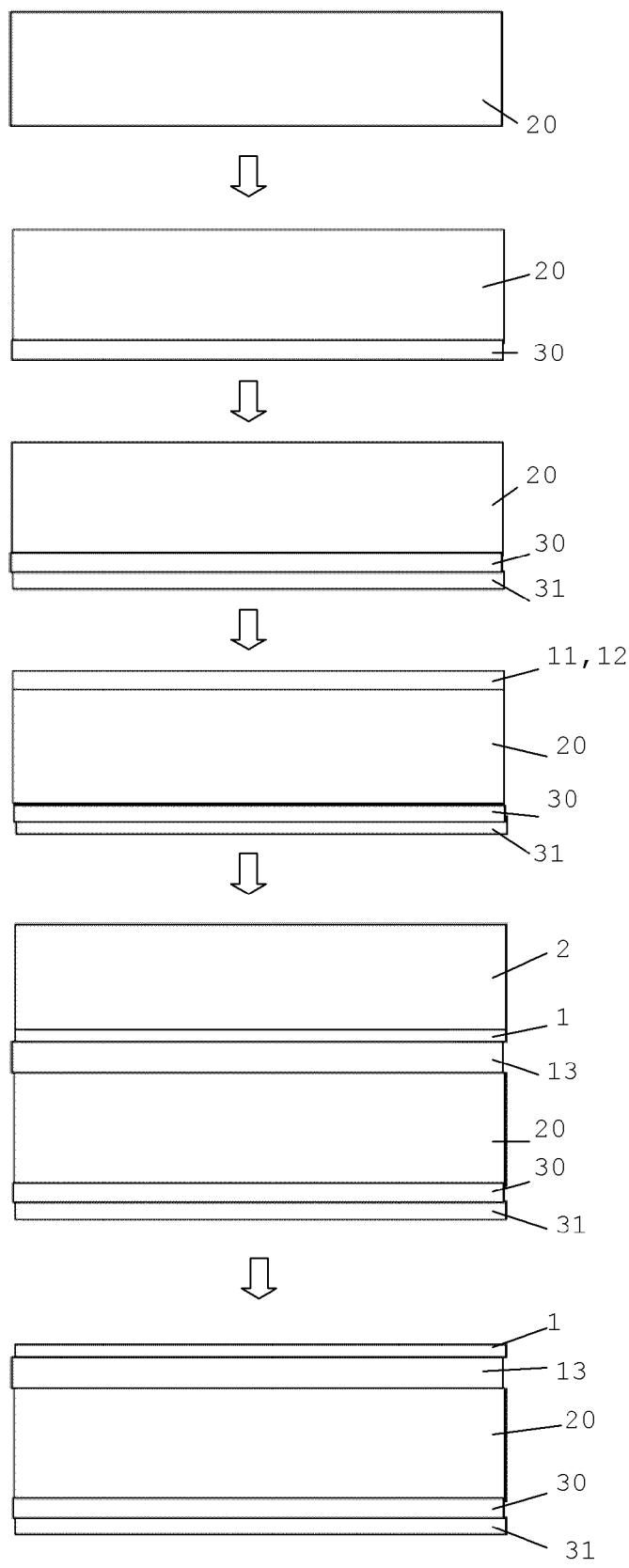
FIG. 3 illustrates the method according to an embodiment.

The method of an embodiment as applied to the GaNLED fabrication process of FIG. 1 is illustrated in FIG. 3. A stress compensation layer 30 is deposited (e.g. by electroplating) on the backside of the carrier wafer 20. The stress compensation layer 30 is a Cu layer, the thickness of which is essentially the sum of the Cu layers 11 on the device wafer 2 and on the carrier wafer 20.

Preferably and as shown in the embodiment of FIG. 3, the stress compensation layer 30 is deposited before the bonding layers 11/12 are deposited at the front of the carrier wafer 20. Alternatively, the compensation layer 30 may be deposited after the bonding layers 11/12.

Also in the embodiment shown, a further layer 31 is deposited on the compensation layer. This further layer is a protection layer configured to prevent direct contact between the production tools and the Cu compensation layer 30 during the further processing and in this way to prevent spreading Cu contamination. The latter is important especially at silicon processing production facilities. This protection layer may be a SiN layer, deposited by PECVD (Plasma Enhanced Chemical Vapor Deposition).

The actual bonding process takes place in the same way as in the prior art method described above. The device wafer 2 is bonded to the carrier wafer 20 and then removed by thinning and wet etching. After bonding, and after grinding and etching the Si device wafer 2, no warping of the carrier 20 takes place due to the presence of the stress compensation layer 30.

Another embodiment is relevant for the GaNLED application described above, and also for CMOS applications. According to the latter embodiment, an intermediate diffusion-inhibiting layer is produced between the backside of the carrier wafer 20 and the stress compensation layer 30. When the stress compensation layer is a Cu layer for example, the intermediate layer may be a SiN layer produced by PECVD on the back side of the carrier wafer, the stress compensation layer being deposited on the SiN layer. The SiN layer is configured to inhibit diffusion of Cu from the stress compensation layer into the carrier wafer. According to a specific embodiment, an intermediate diffusion-inhibiting layer as described above is present on one side of the stress compensation layer 30, and a protection layer 31 is present on the other. Both the diffusion-inhibiting layer and the protection layer may be SiN layers.

The carrier wafer 20 as obtained in the last step of FIG. 3 may be further processed and eventually divided into individual devices, e.g. individual LEDs. The embodiments are thus related to such devices, comprising a device portion and a wafer portion and which are characterized by the presence of a stress compensation layer on the back of the wafer portion. Possibly, a protection layer and/or an anti-diffusion layer may be present on top of or underneath the stress compensation layer respectively.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Unless specifically specified, the description of a layer being deposited or produced 'on' another layer or substrate, includes the options of the layer being produced or deposited directly on, i.e. in contact with, the other layer or substrate, and the layer being produced on one or a stack of intermediate layers between the layer and the other layer or substrate.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

What is claimed is:

1. A layer stack for use in the manufacture of a semiconductor device, comprising:
   a first substrate;
   a semiconductor device layer on a front surface of the first substrate;
   a first bonding stack of one or more metal la ers on toy of the semiconductor device layer;
   a second bonding stack of one or more metal layers on a front surface of a second substrate;
   a metal stress compensation layer on a back surface of the second substrate; and
   a metal bond between the first substrate and the second substrate,
   wherein at least one of the second bonding stack of one or more metal la ers and the first bondin stack of one or more metal la ers com rises a Cu la er and a Sn la er wherein the Sn layer is on top of and in direct contact with the Cu layer.

2. A layer stack for use in the manufacture of a semiconductor device, comprising:
   a first substrate;
   a semiconductor device layer on a front surface of the first substrate;
   a first bonding stack of one or more metal layers on top of the semiconductor device layer;
   a second bondind stack of one or more metal layers on a front surface of a second substrate;
   a metal stress compensation layer on a back surface of the second substrate;
   a protection layer on the metal stress compensation layer; and
   a metal bond between the first substrate and the second substrate.

3. A layer stack for use in the manufacture of a semiconductor device, comprising:
   a first substrate;
   a semiconductor device layer on a front surface of the first substrate;
   a first bonding stack of one or more metal layers on top of the semiconductor device layer;
   a second bonding stack of one or more metal layers on a front surface of a second substrate;
   a metal stress compensation layer on a back surface of the second substrate;
   a diffusion-inhibiting layer situated between the second substrate and the metal stress compensation layer; and
   a metal bond between the first substrate and the second substrate.

4. The layer stack of claim 1, wherein the device is a GaNLED device.

5. A layer stack for use in the manufacture of a semiconductor device, comprising:
   a first substrate;
   a semiconductor device layer on a front surface of the first substrate;
   a first bonding stack of one or more metal layers on top of the semiconductor device layer;
   a second bonding stack of one or more metal layers on a front surface of a second substrate;
   a metal stress compensation layer on a back surface of the second substrate; and
   a metal bond between the first substrate and the second substrate.

6. The layer stack of claim 5, wherein the metal bond is formed by bringing the first bonding stack of one or more metal layers and the second bonding stack of one or more metal layers into mutual contact under conditions of mechanical pressure and temperature.

7. The layer stack of claim 5, wherein the metal stress compensation layer is a single layer of a same material as a topmost metal layer of the second bonding stack of one or more metal layers.

8. The layer stack of claim 5, wherein a thickness of the metal stress compensation layer is less than or equal to a thickness of a topmost metal layer of the second bonding stack of one or more metal layers.

9. The layer stack of claim 5, wherein a thickness of the metal stress compensation layer is equal to a sum of a thickness of a topmost metal layer of the second bonding stack of one or more metal layers and a thickness of a topmost metal layer of the first bonding stack of one or more metal layers.

10. The layer stack of claim 5, wherein a thickness of the metal stress compensation layer is equal to a sum of a thickness of the second bonding stack of one or more metal layers and a thickness of the first bonding stack of one or more metal layers.

11. The layer stack of claim 2, wherein the protection layer is a SiN layer.

12. The layer stack of claim 3, wherein the diffusion-inhibiting layer is a SiN layer.

13. The layer stack of claim 1, wherein the first substrate is a wafer.

14. The layer stack of claim 2, wherein the first substrate is a wafer.

15. The layer stack of claim 3, wherein the first substrate is a wafer.

16. The layer stack of claim 5, wherein the first substrate is a wafer.

17. The layer stack of claim 2, wherein the device is a GaNLED device.

18. The layer stack of claim 3, wherein the device is a GaNLED device.

19. The layer stack of claim 5, wherein the device is a GaNLED device.

\* \* \* \* \*

UNITED STATES PATENT AND TRADEMARK OFFICE
CERTIFICATE OF CORRECTION

| | | |
|---|---|---|
| PATENT NO. | : 9,105,827 B2 | Page 1 of 1 |
| APPLICATION NO. | : 14/322787 | |
| DATED | : August 11, 2015 | |
| INVENTOR(S) | : Nga Phuong Pham | |

It is certified that error appears in the above-identified patent and that said Letters Patent is hereby corrected as shown below:

In the Specification

In column 4 at line 8, Before "followed" insert --11--.

In the Claims

In column 7 at line 58, In Claim 1, change "la ers" to --layers--.

In column 7 at line 58, In Claim 1, change "toy" to --top--.

In column 7 at line 67, In Claim 1, change "la ers" to --layers--.

In column 7 at line 67, In Claim 1, change "bondin" to --bonding--.

In column 8 at line 1, In Claim 1, change "la ers com rises" to --layers comprises--.

In column 8 at line 1, In Claim 1, change "la er" to --layer--.

In column 8 at line 1, In Claim 1, change "la er" to --layer,--.

In column 8 at line 12 (approx.), In Claim 1, change "bondind" to --bonding--.

Signed and Sealed this
Seventeenth Day of May, 2016

Michelle K. Lee
*Director of the United States Patent and Trademark Office*